(12) United States Patent
Nagahara et al.

(10) Patent No.: US 10,274,843 B2
(45) Date of Patent: Apr. 30, 2019

(54) EXPOSURE APPARATUS, EXPOSURE METHOD AND STORAGE MEDIUM

(71) Applicant: Tokyo Electron Limited, Tokyo (JP)

(72) Inventors: Seiji Nagahara, Tokyo (JP); Masaru Tomono, Koshi (JP); Nobutaka Fukunaga, Koshi (JP); Gousuke Shiraishi, Koshi (JP); Yukie Minekawa, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 0 days.

(21) Appl. No.: 15/815,925

(22) Filed: Nov. 17, 2017

(65) Prior Publication Data
US 2018/0143540 A1 May 24, 2018

(30) Foreign Application Priority Data

Nov. 18, 2016 (JP) ................. 2016-225324

(51) Int. Cl.
*G03F 7/20* (2006.01)
*H01L 21/67* (2006.01)
*H01L 21/677* (2006.01)

(52) U.S. Cl.
CPC ........ *G03F 7/70725* (2013.01); *G03F 7/2022* (2013.01); *G03F 7/70558* (2013.01);
(Continued)

(58) Field of Classification Search
CPC ............. G03F 7/70725; G03F 7/70775; G03F 7/70745; G03F 7/70425; G03F 7/70458;
(Continued)

(56) References Cited

U.S. PATENT DOCUMENTS

| 5,028,955 A * | 7/1991 | Hayashida .......... G03F 7/70725 355/53 |
| 2009/0174873 A1* | 7/2009 | Kikuchi .............. G03F 7/70425 355/53 |

(Continued)

FOREIGN PATENT DOCUMENTS

| JP | 2009-194346 | 8/2009 |
| JP | 2015-156472 A1 | 8/2015 |

OTHER PUBLICATIONS

European Search Report (Application No. 17202291.5) dated Apr. 6, 2018.

*Primary Examiner* — Steven Whitesell Gordon
(74) *Attorney, Agent, or Firm* — Burr & Brown, PLLC

(57) ABSTRACT

An exposure apparatus includes: a stage on which a substrate is placed; a plurality of light irradiation units configured to emit light independently of each other, so as to form a strip-like irradiation area; a rotation mechanism configured to rotate the substrate relative to the irradiation area; a stage moving mechanism configured to move the stage relative to the irradiation area in a back and forth direction; and a control unit configured to make the exposure apparatus perform a first step that rotates the substrate relative to the irradiation area having a first illuminance distribution such that the whole surface of the substrate is exposed, and a second step that moves the substrate in the back and forth direction relative to the irradiation area having a second illuminance distribution while rotation of the substrate is being stopped, such that the whole surface of the substrate is exposed.

7 Claims, 14 Drawing Sheets

(52) U.S. Cl.
CPC .... *G03F 7/70775* (2013.01); *H01L 21/67178* (2013.01); *H01L 21/67225* (2013.01); *H01L 21/67718* (2013.01)

(58) Field of Classification Search
CPC ............. G03F 7/70466; H01L 21/0231; H01L 21/02345; H01L 21/02348
See application file for complete search history.

(56) References Cited

U.S. PATENT DOCUMENTS

2010/0067886 A1\* 3/2010 Liu .................. H01L 21/02126
392/416
2016/0327869 A1 11/2016 Nagahara et al.

\* cited by examiner

US 10,274,843 B2

EXPOSURE APPARATUS, EXPOSURE METHOD AND STORAGE MEDIUM

CROSS REFERENCE TO RELATED APPLICATIONS

This application is based upon and claims the benefit of priority from Japanese Patent Application No. 2016-225324, filed on Nov. 18, 2016, the entire contents of which is incorporated herein by reference.

FIELD OF THE INVENTION

The present invention relates to a technique of exposing the whole surface of a substrate.

BACKGROUND ART

A manufacturing process of a semiconductor device may include a process that exposes the whole surface of a substrate (referred to as "wafer" herebelow), e.g., a semiconductor wafer. For example, JP2015-156472A (Patent Document 1) describes that a resist film made of a photosensitized chemically amplified resist is formed on a surface of a wafer, the resist film is exposed with the use of a pattern mask (pattern exposure), and then the whole surface of the wafer is exposed (flood exposure). By the flood exposure, acid increases in areas of the resist film subjected to the pattern exposure. Thereafter, the wafer is subjected to a heating process and a developing process so that the aforementioned areas are dissolved and a resist pattern is thus formed. The exposure of the whole surface of the wafer is performed by using laterally-arranged plural LEDs (light-emitting diodes) each emitting light downward, and by moving the wafer below the array of LEDs in the back and forth direction.

The CD (Critical Dimension), which is the dimension of the resist pattern formed after development, varies depending on the exposure amounts during the flood exposure. Controlling the exposure amounts in respective portions of the wafer in order to uniformize the CD in the plane of the wafer has been studied. However, as also described later in the "Description of Embodiments" section, in the photolithographic step, there are several factors that make different the CD in respective portions in the plane of the wafer. Since each factor has a unique impact on the CD distribution in the plane of the wafer, the required exposure amount distribution in the plane of the wafer for uniformizing the CD is complicated.

SUMMARY OF THE INVENTION

The object of the present invention is to provide an exposure apparatus for exposing the whole surface of a substrate, which is capable of precisely controlling exposure amounts at respective points in the plane of the substrate.

In one embodiment of the present invention, there is provided an exposure apparatus, which includes: a stage on which a substrate is placed; a plurality of light irradiation units configured to emit light independently of each other to different positions in a right and left direction on a surface of the substrate, so as to form a strip-like irradiation area extending from one end of the surface of the substrate to the other end of the substrate; a rotation mechanism configured to rotate the substrate placed on the stage relative to the irradiation area; a stage moving mechanism configured to move the stage relative to the irradiation area in a back and forth direction; and a control unit configured to output control signals that make said exposure apparatus perform a first step that rotates the substrate relative to the irradiation area having a first illuminance distribution such that the whole surface of the substrate is exposed, and a second step that moves the substrate in the back and forth direction relative to the irradiation area having a second illuminance distribution while rotation of the substrate is being stopped, such that the whole surface of the substrate is exposed.

In another embodiment of the present invention, there is provided an exposure method, which includes: placing a substrate on a stage; forming a strip-like irradiation area extending from one end to the other end of a surface of the substrate by means of a plurality of light irradiation units that emit light independently of each other to different positions of the surface of the substrate in a right and left direction; rotating the substrate placed on the stage relative to the irradiation area having a first illuminance distribution, such that the whole surface of the substrate is exposed; and moving the substrate placed on the stage relative to the irradiation area having a second illuminance distribution in a back and forth direction, while rotation of the substrate is being stopped, such that the whole surface of the substrate is exposed.

In yet another embodiment of the present invention, there is provided storage medium storing a computer program to be used in an exposure apparatus for exposing a substrate, wherein the computer program includes a group of steps for performing the above exposure method.

According to the foregoing embodiments, the substrate is rotated relative to the irradiation area such that the whole surface of the substrate is exposed, while the first illuminance distribution is established in the strip-like irradiation area formed by the plurality of light irradiation units. In addition, the substrate is moved in the back and forth direction with respect to the irradiation area, while the rotation of the substrate is being stopped, such that the whole surface of the substrate is exposed, while the second illuminance distribution is established in the irradiation area. Thus, exposure amounts in respective portions of the substrate can be precisely controlled such that desired exposure amounts can be obtained.

DETAILED DESCRIPTION OF THE INVENTION

Figure 1:
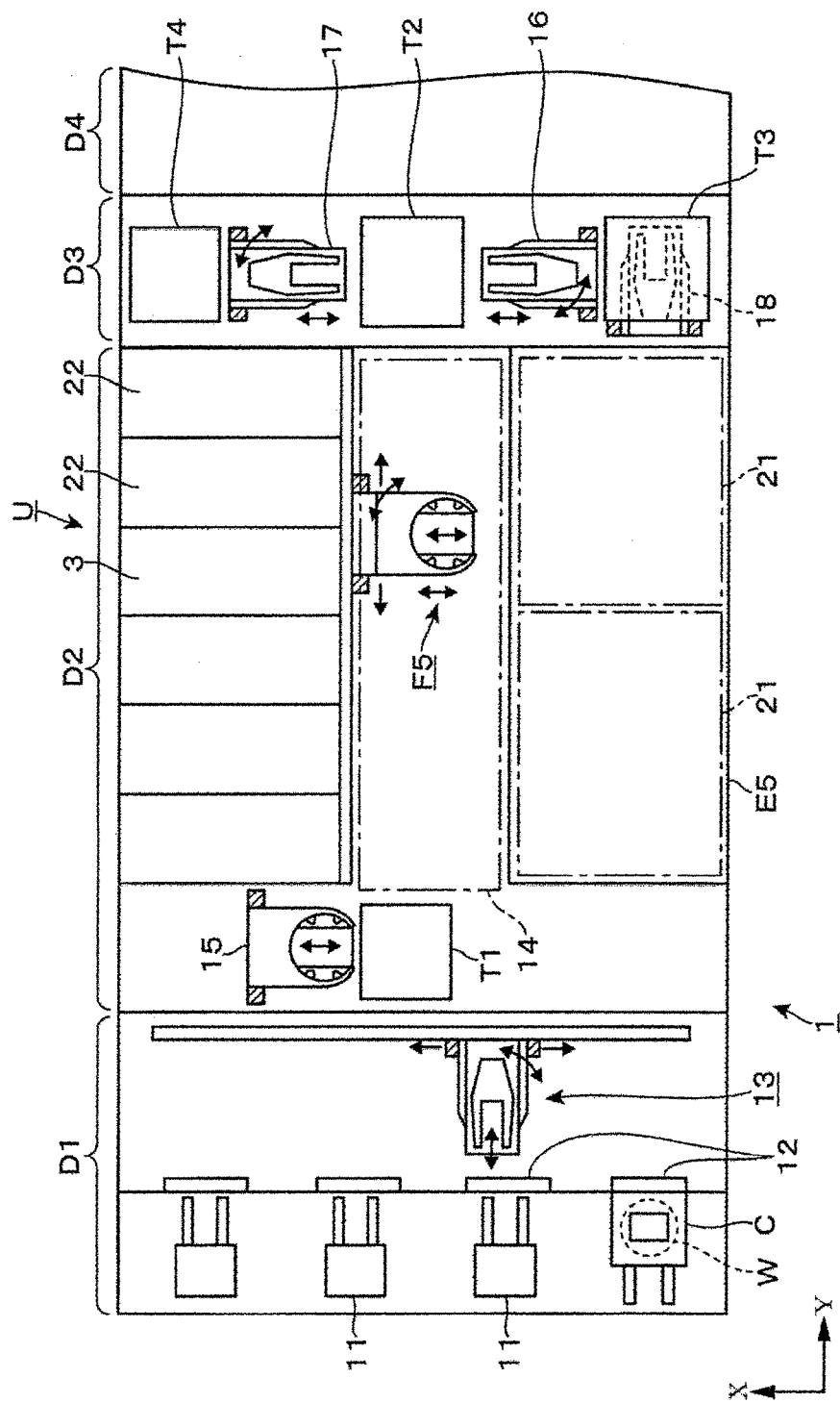
FIG. 1 is a plan view of a coating and developing apparatus to which an exposure apparatus of the present invention is applied.
Figure 2:
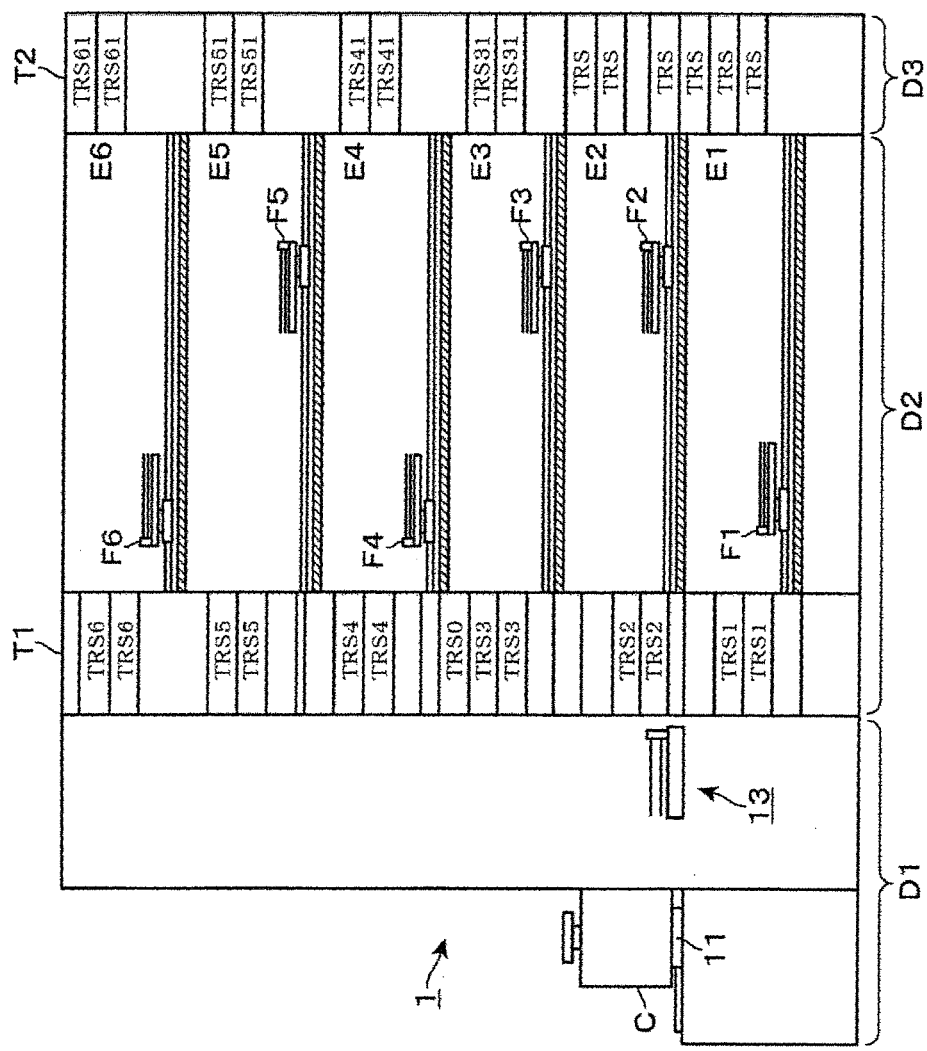
FIG. 2 is a vertically-sectioned side view of the coating and developing apparatus.

First, the description is made to the entire structure of a coating and developing apparatus 1 with reference to FIGS. 1 and 2, which are a plan view and a schematic vertically-sectioned side view of the apparatus 1, respectively. The coating and developing apparatus 1 is formed by horizontally and linearly connecting a carrier block D1, a processing block D2 and an interface block D3. For the sake of convenience, the direction in which these blocks D1 to D3 are arranged is referred to as "Y direction", and a horizontal direction perpendicular to the Y direction is referred to as "X direction". An exposure apparatus D4 is connected to the interface block D3. The carrier block D1 has stages 11 on each of which a carrier C is placed. The carrier C can accommodate circular wafers W (i.e., substrate(s)). In FIG. 1, reference sign 12 depicts an opening and closing unit, and reference sign 13 depicts a transfer mechanism for transporting a wafer W between the carriers C and the processing block D2.

The processing block D2 is formed by stacking unit blocks E1 to E6 in this order from below. Each of the unit blocks E1 to E6 is configured to perform a liquid treatment to the wafer W. In these unit block E1 to E6, wafers W are transported and processed in parallel. The unit blocks E1 and E2 have the same structure, the unit blocks E3 and E4 have the same structure, and the unit blocks E5 and E6 have the same structure.

The unit block E5 is described as a representative with reference to FIG. 1. A transport area 14 extends from the carrier block D1 toward the interface block D3. A plurality of shelf units U are arranged side by side in the back and forth direction on one side of the transport area 14 with respect to the X direction, while two developing modules 21 are arranged side by side in the Y direction on the other side of the transport area 14. Each developing module 21 supplies a developer to a resist film formed on the surface of the wafer W. The shelf unit U includes heating modules 22 each for heating the wafer W, and flood exposure modules 3. The flood exposure module 3 is an exposure apparatus in one embodiment of the present invention. The flood exposure module 3 exposes the whole surface of the wafer W. In this specification, exposure of the whole surface is referred to as flood exposure. The detailed structure of the flood exposure module 3 is described later. The transport area 14 is provided with a transport arm F5 (i.e., a wafer transport mechanism). Wafers W are transported among the modules provided in the unit block E5, and modules in towers T1 and T2 (described later) located at a level of the unit block E5.

The unit blocks E1 to E4 have the same structure as that of the unit blocks E5 and E6, excluding that different chemical liquids are supplied to wafers W. The unit blocks E1 and E2 each include, instead of the developing modules 21, antireflection film forming modules that each supply the wafer W with a chemical liquid for forming an antireflection film. The unit blocks E3 and E4 each include, instead of the developing modules 21, resist film forming modules that each form a resist film by supplying the wafer W with a resist called "photosensitized chemically amplified resist". In FIG. 2, transport arms in the unit blocks E1 to E6 are depicted by reference signs F1 to F6, respectively.

On the carrier block D1 side in the processing block D2, there are disposed the tower T1 vertically extending across the unit blocks E1 to E6, and a transfer arm 15 that is a vertically-movable transfer mechanism for transferring the wafer W to the tower T1. The tower T1 is formed of a plurality of modules, stacked one on another, including transfer modules TRS on each of which the wafer W is to be placed.

The interface block D3 includes towers T2, T3 and T4 vertically extending across the unit blocks E1 to E6, and includes an interface arm 16 that is a vertically-movable transfer mechanism for transferring the wafer W to the tower T2 and the tower T3, an interface arm 17 that is a vertically-movable transfer mechanism for transferring the wafer W to the tower T2 and the tower T4, and an interface arm 18 for transferring a wafer W between the tower T2 and the exposure apparatus D4. The exposure apparatus D4 exposes the surface of the wafer W with extreme ultraviolet (EUV), for example, using a pattern mask. In other words, unlike the flood exposure module 3, the exposure apparatus D4 exposes only parts of the surface of the wafer W. In order to discriminate the exposure by the exposure apparatus 4 from the flood exposure by the flood exposure module 3, the former is sometimes referred to as "pattern exposure".

Although the tower T2 is formed by stacking one on another the transfer modules TRS, a buffer module(s) in which a plurality of unexposed wafers W are stored, and a temperature adjusting module(s) SCPL that adjusts the temperature of the wafer W, and so on. Illustration of the buffer module(s) and the temperature adjusting module(s) are omitted in the attached drawings. Although towers T3 and T4 have modules, description thereof is omitted.

A transport route of the wafer W in the system composed of the coating and developing apparatus 1 and the exposure apparatus D4 is described. The wafer W is transported by the transfer mechanism 13 from the carrier 11 to the transfer module TRS0 of the tower T1 in the processing block D2. From the transfer module TRS0, the wafer W is transported to one of the unit blocks E1 or E2 allocated to that wafer W. For example, if the wafer W is to be transported to the unit block E1, the wafer W is transferred from the transfer module TRS0 to a transfer module TRS1 (this is a transfer module to and from which the transport arm F1 can transfer the wafer W, and which corresponds to the unit block E1) among the transfer modules TRS in the tower T1. On the other hand, if the wafer W is to be transferred to the unit block E2, the wafer W is transferred from the TRS0 to a transfer module TRS2, corresponding to the unit block E2, among the transfer modules TRS in the tower T1. The aforementioned transferring of the wafer W is carried out by the transfer arm 15.

The wafer W thus transferred as described above is transported from the transfer module TRS1 (or TRS2), to the antireflection film forming module, to the heating module, and to the transfer module TRS1 (or TRS2) in this order. Following thereto, the wafer W is transported by the transfer arm 15 to one of the transfer module TRS3 corresponding to the unit block E3 and the transfer module TRS4 corresponding to the unit block E4 allocated to that wafer W.

The wafer W transferred to the transfer module TRS3 or TRS4 is transported from the transfer module TRS3 (TRS4)

to the resist film forming module, in which a photosensitized chemically amplified resist is applied to the whole surface of the wafer W so as to form a resist film. Thereafter, the wafer W is transported to the heating module and to the transfer module TRS in the tower T2 in this order. After that, the wafer W is loaded into the exposure apparatus D4 by the interface arms 16 and 18 through the tower T3. Then, the resist film is subjected to pattern exposure, and acid and photosensitizer are generated in the exposed areas.

The wafer W having been subjected to the pattern exposure is transported between the towers T2 and T4 by the interface arms 16 and 17, and is transported to a transfer module TRS51 or TRS61 in the tower T2 corresponding to the unit block E5 or E6. Thereafter, the whole surface of the wafer W is exposed in the flood exposure module 3. Thus, the aforementioned photosensitizer absorbs light so that acid and photosensitizer are further generated in the areas exposed by the pattern exposure. Namely, the flood exposure increases the acid only in the areas exposed by the pattern exposure. Thereafter, the wafer W is transported to the heating module 22 to be heated therein, so that a so-called post exposure baking (PEB) is performed in the heating module 22.

The PEB alters the exposed areas by the pattern exposure so that those exposed areas become soluble in a developer by the acid. Then, the wafer W is transported to the developing module 21, in which the wafer W is supplied with a developer. The altered areas are dissolved in the developer, so that a resist pattern is formed. After that, the wafer W is transported to the transfer module TRS5 or TRS6 in the tower T1, and is then returned to the carrier C by the transfer mechanism 13.

Figure 3:
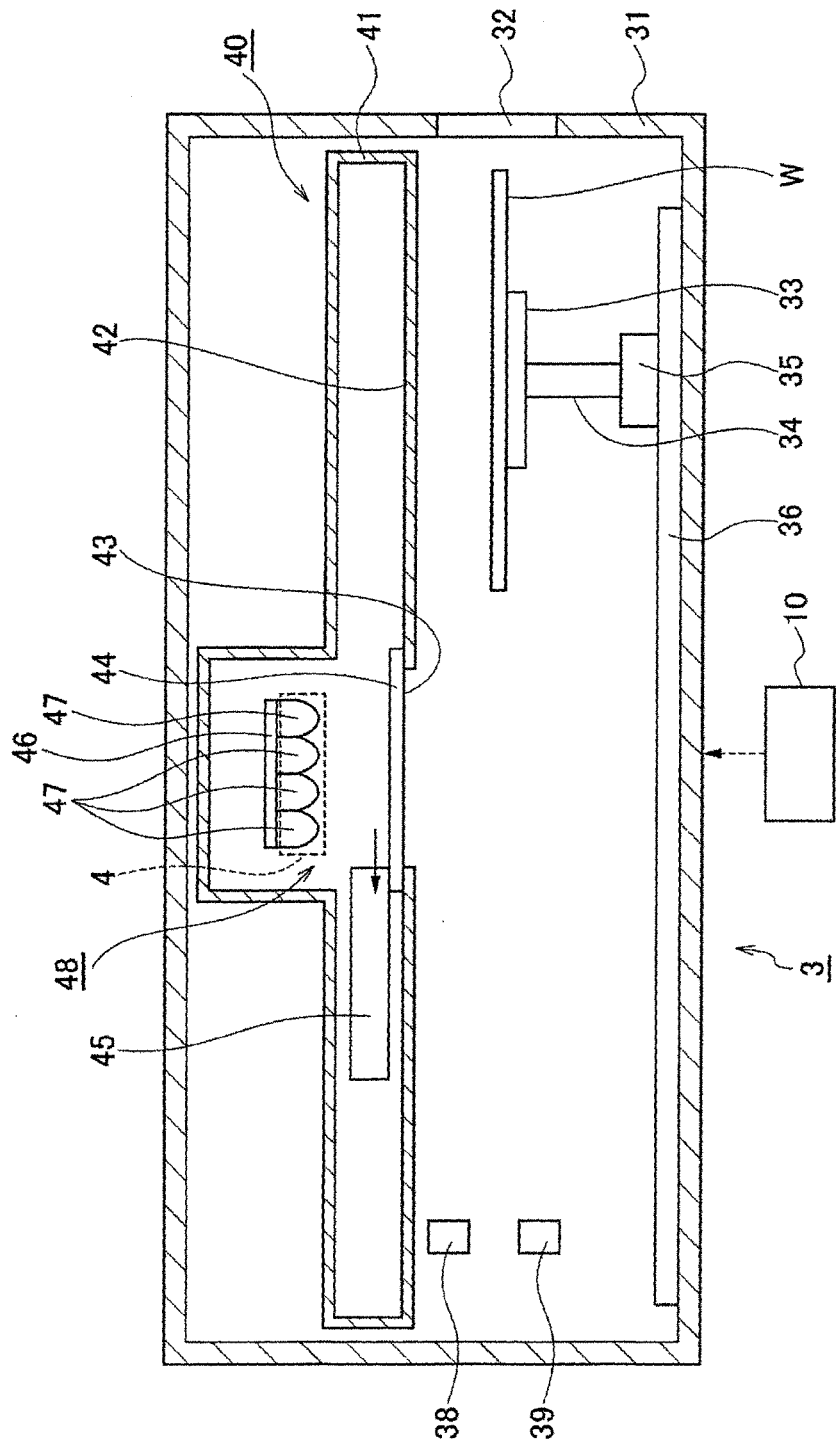
FIG. 3 is a vertically-sectioned side view of a flood exposure module disposed in the coating and developing apparatus.
Figure 4:
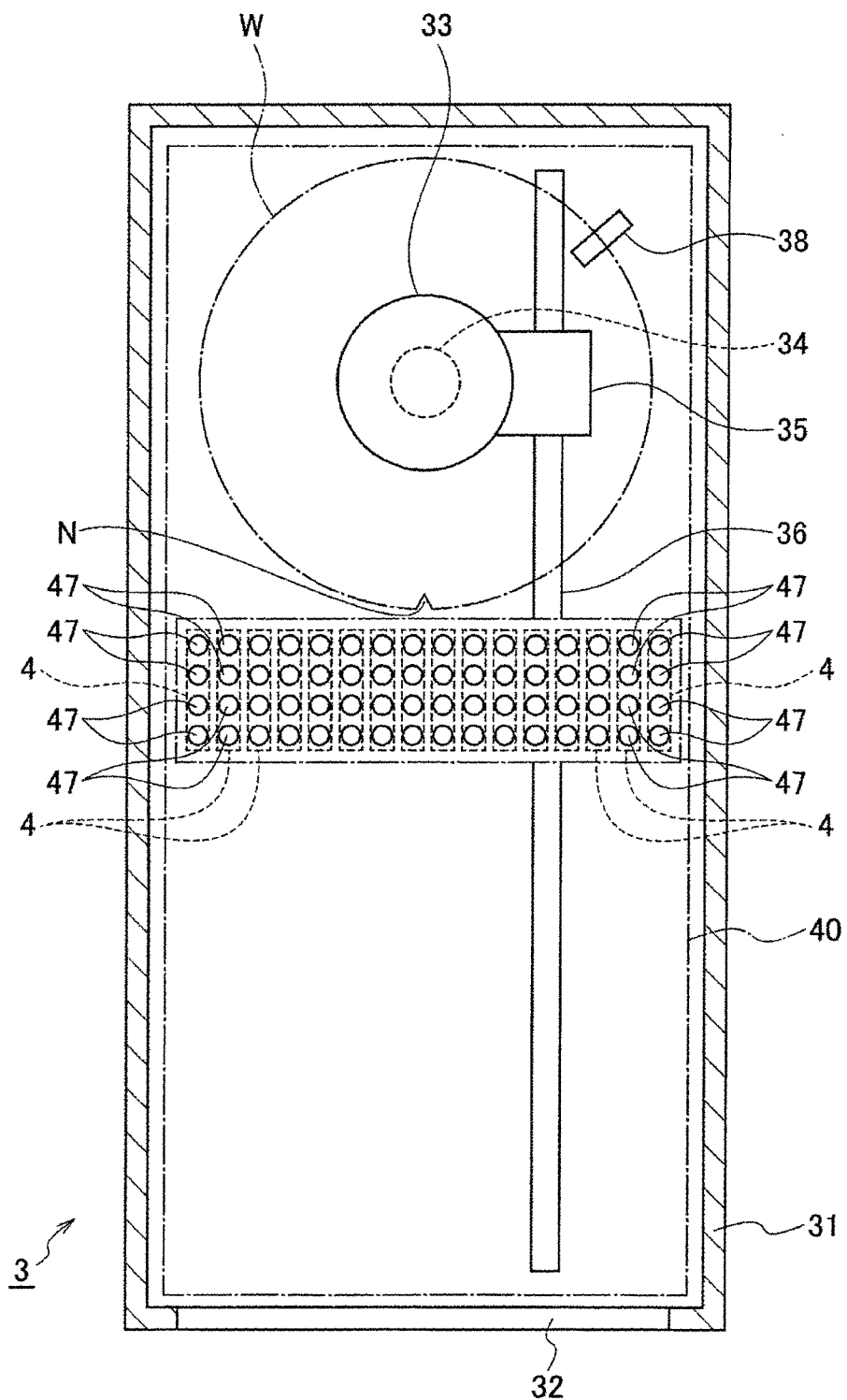
FIG. 4 is a laterally-sectioned side view of the flood exposure module.

Next, the flood exposure module 3 disposed in the unit block E5 is described with reference to FIG. 3 which is a vertically-sectioned side view, and FIG. 4 which is a laterally-sectioned plan view. In FIGS. 3 and 4, reference sign 31 depicts a housing. A transport opening 32 for the wafer W is opened in a sidewall of the housing 31. A circular stage 33 for placing thereon the wafer W in horizontal posture is disposed in the housing 31. The aforementioned transport arm F5 transfers the wafer W to the stage 33 such that their central axes are aligned with each other. The stage 33 holds the wafer W placed thereon by suction.

In FIGS. 3 and 4, reference sign 34 depicts a rotation mechanism provided below the stage 33, which rotates the stage 33 such that the wafer W placed on the stage 33 is rotated about the central axis. In FIGS. 3 and 4, reference sign depicts a support table which supports the rotation mechanism 34 from below. In FIGS. 3 and 4, reference sign 36 depicts a stage moving mechanism including a motor and a ball screw. The ball screw is rotated by the motor, so that the support table 35 connected to the ball screw is horizontally moved together with the stage 33 in the back and forth direction. During the below-described flood exposure to the wafer W, the stage 33 moves horizontally at a constant speed, for example.

By the movement of the support table 35, the stage 33 is moved between a transfer position, which is relatively close to the transport opening 32 in the housing 31, and an orientation adjustment position, which is relatively distantly apart from the transport opening 32 in the housing 31. At the transfer position, the wafer W is transferred to and from the stage 33 by the transport arm F5. At the orientation adjustment position, the orientation of the wafer W is adjusted, which will be described later. FIG. 3 shows the stage 33 located at the transfer position, and FIG. 4 shows the stage 33 located at the orientation adjustment position. In the below description, for the purpose of indicating the moving direction of the stage 33, the side of the transfer position is referred to as "front side (forth, forward)", and the side of the orientation adjustment position is referred to as "rear side (back, backward)".

On the rear side in the housing 31, a light emitting unit 38 and a light receiving unit 39 are disposed, which form a detection mechanism for detecting a notch N that is a cutout formed in the periphery of the wafer W. The light emitting unit 38 and the light receiving unit 39 are positioned such that the peripheral part of the wafer W, which is placed on the stage 33 located at the orientation adjustment position, is sandwiched between these units 38 and 39 in the vertical direction. During the rotation of the wafer W by the stage 33, light is emitted from the light emitting unit 38 to the light receiving unit 39. Based on the change in amount of light received by the light receiving unit 39, a control unit 10 (described later) detects the notch N. The rotation mechanism 34 is rotated based on a control signal outputted from the control unit 10 serving as an orientation adjustment mechanism, and the orientation of the wafer W is adjusted such that the detected notch N is directed in a predetermined orientation.

A light source unit 40 is disposed above a wafer moving path along which the wafer W is moved by the stage moving mechanism 36. The light source unit 40 includes a case body 41, a shutter 44, a support board 46 and an LED group (a group of LEDs) 48. A lower part of the case body 41 is formed as a horizontal plate 42 that covers, from above, the wafer moving path along which the wafer W is moved by the stage moving mechanism 36 in the back and forth direction. An exposure opening 43 extending in the right and left direction is formed in a central part of the horizontal plate 42 with respect to the back and forth direction. The shutter 44 is disposed on the horizontal plate 42. The shutter 44 is moved by a shutter moving mechanism 45 provided in the case body 41 between a close position at which the shutter 44 closes the exposure opening 43, and an open position at which the shutter 44 opens the exposure opening 43. The open position is located on the rear side of the close position.

In the case body 41, the support board 46 is disposed above the exposure opening 43 in horizontal posture. A large number of LEDs (light-emitting diodes) 47 are supported on a lower surface of the support board 46, such that each LED 47 can emit downward ultraviolet light having a wavelength of, e.g., 365 nm. In the illustrated embodiment, the number of the LEDs 47 is 356 in total, and the LEDs 47 are arranged in a matrix of 4×89 (four rows/eighty-nine columns). The number of the LEDs 47 in the back and forth direction is 4, and the number of LEDs in the right and left direction is 89. However, for the simplicity of the drawing, FIG. 4 shows only 20 LEDs 47 arranged in the right and left direction. The LEDs 47 arranged in a matrix is collectively referred to as "LED group 48". Ultraviolet light emitted from the LED group 48 forms a strip-like ultraviolet irradiation area 30 formed at a height position of the surface of the wafer W placed on the stage 33 (in other words, the irradiation area 30 is formed on an imaginary horizontal plane including the surface of the wafer W placed on the stage 33).

Figure 5:
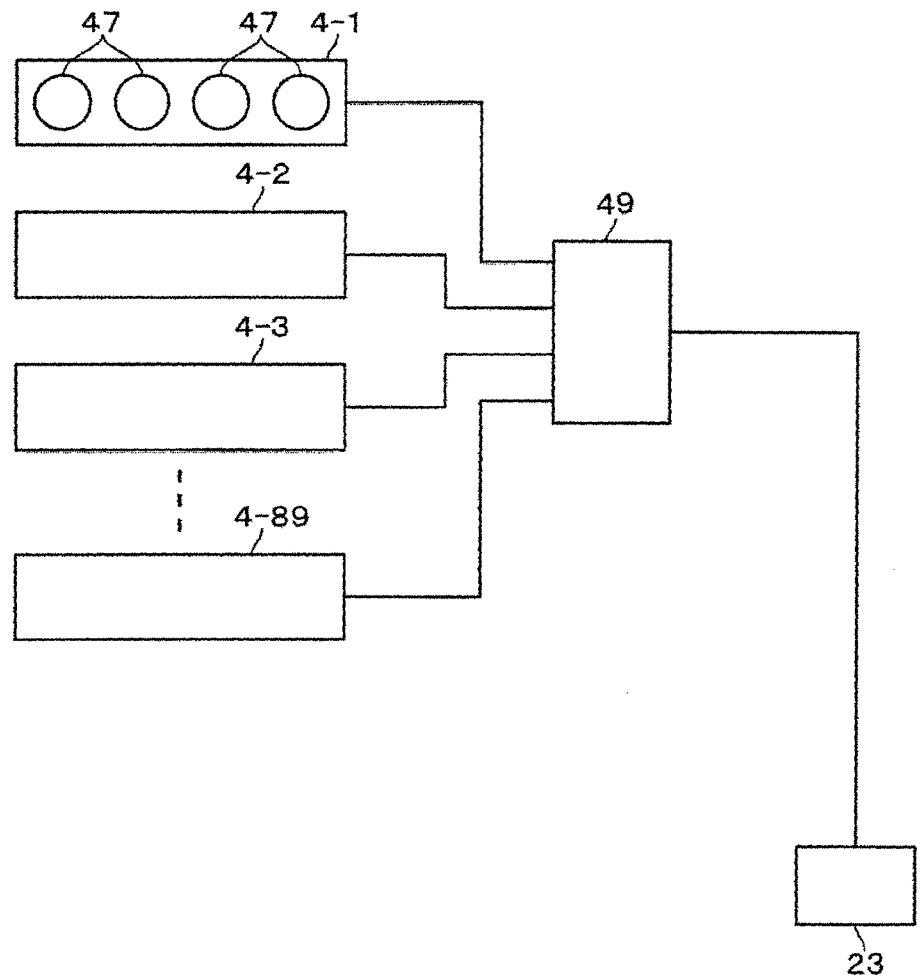
FIG. 5 is a block diagram showing the structure of cells provided in the flood exposure module.

In the LED group 48, four LEDs 47 arranged along a line extending in the back and forth direction are referred to as cell 4. In order to discriminate the cells 4 from one another, the identification number (1 to 89) indicating the position of the column of the matrix to which the cell 4 belongs may be connected to reference sign 4 with a hyphen, such as 4-1, 4-2, 4-3 . . . 4-89, as needed basis. The identification numbers of the cells assigned sequentially from one side to the other side in the right and left direction. As shown in a block diagram of FIG. 5, the cells 4 are connected to a power source 23 through a current adjustment unit 49. The power source 23 may be provided outside the housing 31, for example. The current adjustment unit 49 adjusts currents supplied from the power source 23 to the LEDs 47 cell by cell. As the supply current increases, the light quantity outputted from the cell 4 increases. During the operation of the flood exposure module 3, light may be always emitted from the LED group 48, for example.

Figure 6:
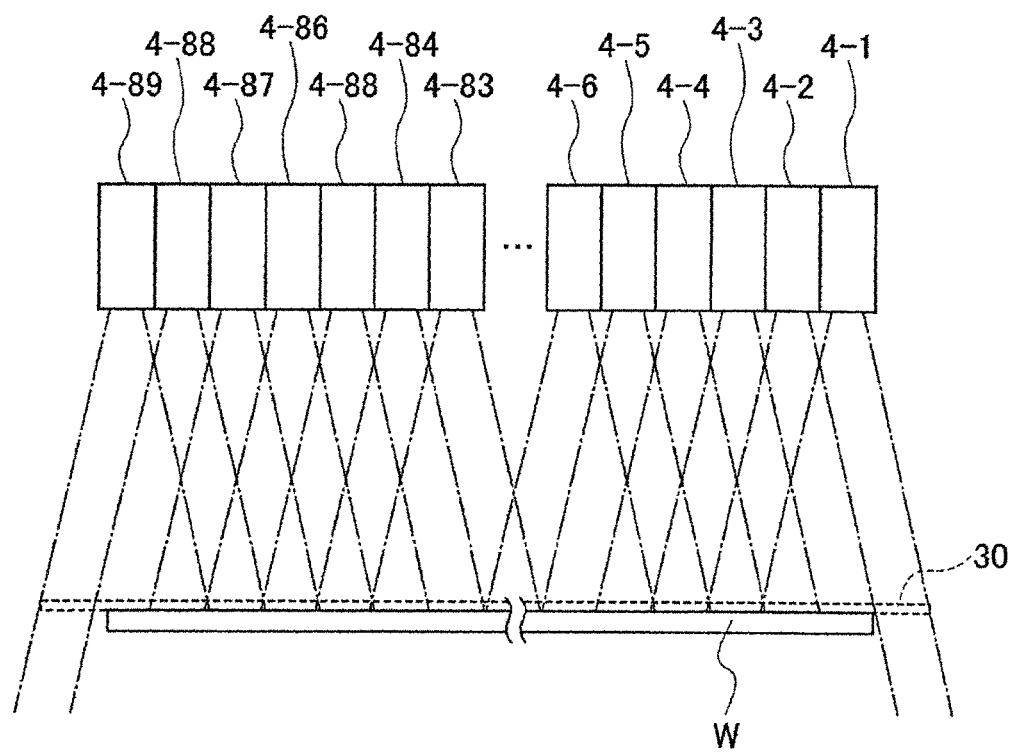
FIG. 6 is a side view of the cells and an irradiation area formed by the cells.

FIG. 6 shows the irradiation area 30 and the cells 4 as viewed in the back and forth direction. The dotted chain lines show the light paths of ultraviolet light emitted from the respective cells 4. The irradiation angle of the LEDs 47 constituting one cell 4 is not more than 100°, for example. As shown in FIG. 6, the ultraviolet light emitted from each cell 4 gradually spreads in the right and left direction, as it goes downward. Any portion of the wafer W is irradiated with ultraviolet light from a plurality of cells 4 among the cells 4 so as to be exposed.

As described above, since currents to be supplied to the respective cells 4 are individually controlled so that light quantities from the respective cells 4 are controlled, the illuminance distribution of the irradiation area 30 in the right and left direction can be adjusted. The flood exposure process is performed by moving the wafer W in the back and forth direction relative to the irradiation area 30 whose illuminance distribution has been adjusted appropriately. Thus, exposure amounts at respective portions of the wafer W can be adjusted by adjusting the illuminance distribution of the irradiation area 30. A larger exposure amount of an area results in generation of a larger amount of acid and thus results in a larger CD of the pattern.

As shown in FIG. 3, the flood exposure module 3 is provided with the control unit 10 comprising a computer. The control unit 10 has a program, not shown. The program includes a group of steps by which exposure of the wafer W, which will be described below, can be carried out by transmitting control signals to units/devices of the flood exposure module 3. Specifically, upon execution of the program, there are performed the operations including: rotation of the stage 33 by the rotation mechanism 34; back and forth movement of the stage 33 by the rotation mechanism 34; detection of a notch N by the light transmitting unit 38 and the light receiving unit 39; opening and closing of the shutter 44 by the shutter moving mechanism 45; adjustment of an illuminance distribution of the irradiation area 30 by the current adjustment unit 49; and so on. The program is stored in a storage medium such as a compact disc, a hard disc, an MO (photo optical disc) or a memory card, and is installed in the control unit 10.

As previously described in the "Background of the Invention" section, the CD in the plane of the wafer W deviates from a set value due to various factors affecting on the wafer W. One of these factors may be such that it causes a relatively large variation in the CD in a first direction from one end to the other end of the wafer W, while it causes no or a relatively small variation in the CD in a second direction perpendicular to the first direction. Such a factor is referred to as "factor 1". An example of the factor 1 is variation of the heating temperature in the diametrical direction of the wafer W when the wafer W is heated by any one of the heating modules after applying a resist onto the wafer W.

Another one of these factors may be such that it causes no or a relatively small variation in the CD in the circumferential direction of the wafer W, while it causes a relatively large variation in the CD in the diametrical direction of the wafer W. Due to this factor, annular areas are concentrically arranged wherein the CD is the same or substantially the same over one annular area (each area), while different areas have different CDs. Such a factor is referred to as "factor 2". An example of the factor 2 is variation of the thickness of the resist film (which is formed by a spin coating process) in the diametrical direction of the wafer W so that annular areas are concentrically arranged wherein the film thickness is the same or substantially the same over each area while different areas have different film thicknesses. In more detail, due to the variation of the film thickness in respective portions of the wafer W, the amounts of acid generated in respective portions of the resist film are different.

Figure 7:
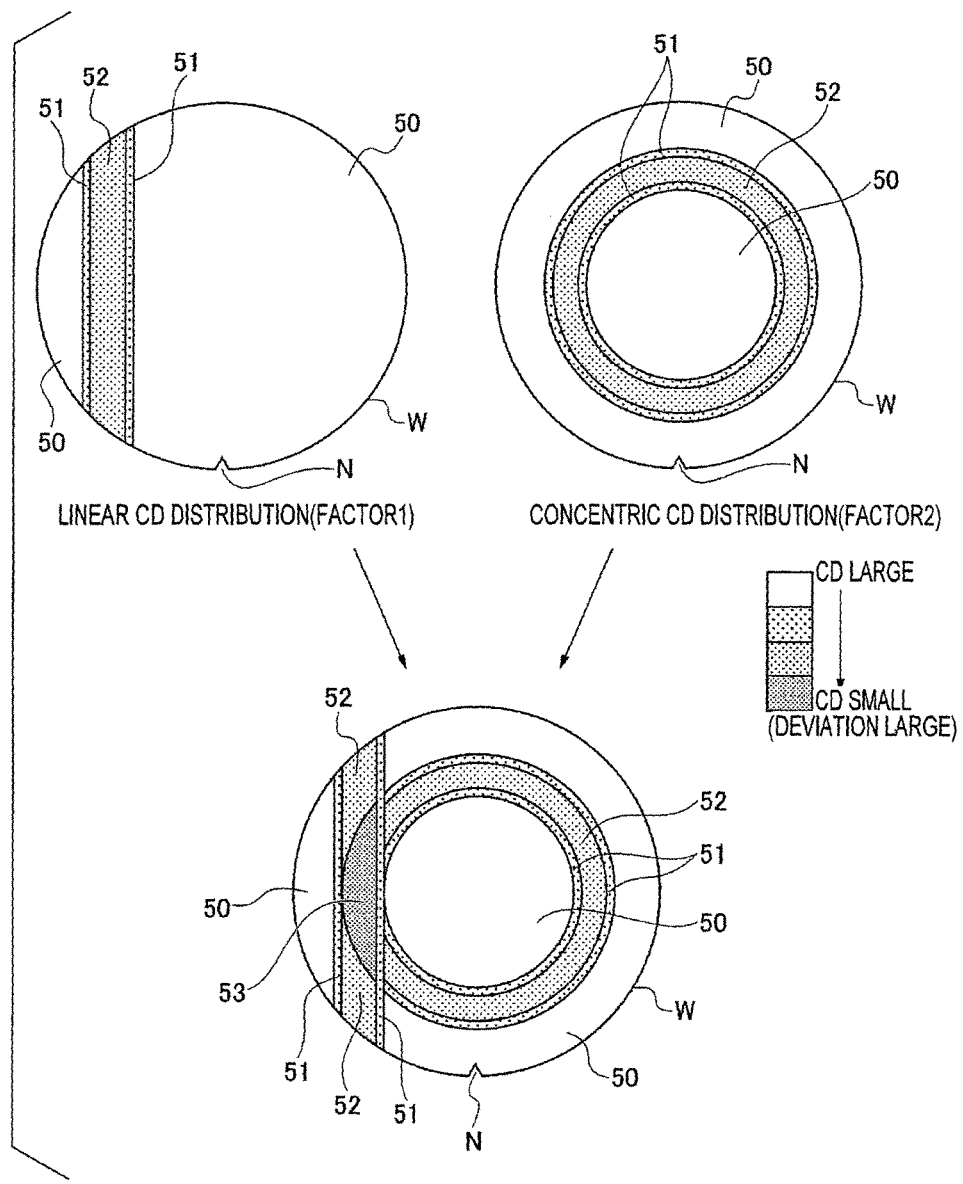
FIG. 7 is explanatory diagram for explaining the CD distribution in the surface of the wafer.

The upper part of FIG. 7 schematically shows a first example (left side in FIG. 7) of the CD distribution of the resist pattern in the plane of the wafer W assuming that only the factor 1 is contributed, and a second example (right side in FIG. 7) of the CD distribution of the resist pattern in the plane of the wafer W assuming that the only the factor 2 is contributed. The CD distribution caused only by the factor 1 is referred to as "linear CD distribution", and the CD distribution caused only by the factor 2 is referred to as "concentric CD distribution". In the upper part of FIG. 7 and the lower part of FIG. 7 which will be described below, areas in the plane of the wafer W in which the CD is relatively largely deviated from the set value to be smaller than the set value is shaded. Such areas are denoted by reference signs 51 to 53, wherein the darkness of the shade indicates the deviation from the set value. The brightness of the shades becomes brighter in the order of the areas 53, 52 and 51, and thus the deviation from the set value becomes smaller in the order of the areas 53, 52 and 51. The area 50 that is not shaded is an area in which the CD deviation is relatively small.

As described above, since the wafer W is affected by both the factors 1 and 2 in fact, the CD deviation caused by the factor 1 and the CD deviation caused by the factor 2 are overlapped in the plane of the wafer W. Thus, on the assumption that the exposure amounts in respective portions in the plane of the wafer W by the flood exposure are uniform, a relatively complicated CD distribution, for example, shown in the lower part of FIG. 7 is obtained. However, such a complicated CD distribution is composed of the linear CD distribution and the concentric CD distribution which are overlapped with each other. Thus, the complicated CD distribution can be compensated by performing the flood exposure in which the exposure amount distribution is determined such that the CD deviation related to the linear CD distribution is canceled, and thereafter or therebefore by performing another flood exposure in which the exposure amount distribution is determined such that the CD deviation related to the concentric CD distribution is canceled. That is, the CD can be made uniform in the whole plane of the wafer W by performing the flood exposure twice. A desired CD at respective portions in the plane of the wafer W can be obtained by uniformizing the sum of the exposure amounts in respective portions in the two flood exposures.

The respective flood exposures for dealing with the linear CD distribution and the concentric CD distribution are described. As described above, the illuminance distribution of the irradiation area 30 in the longitudinal direction (right and left direction) can be adjusted. The flood exposure for dealing with the linear CD distribution is performed by suitably setting the illuminance distribution and by moving the wafer W in the back and forth direction relative to the irradiation area 30, while the orientation of the wafer W is fixed in a predetermined orientation. The flood exposure which is performed with the orientation of the wafer W being fixed is referred to as "non-rotation flood exposure". In the non-rotation flood exposure, the exposure amount distribution in the wafer W in the right and left direction corresponds to the illuminance distribution of the irradiation area 30 in the right and left direction. Thus, the CD deviation related to the linear CD distribution can be canceled in the plane of the wafer W.

On the other hand, the flood exposure for dealing with the concentric CD distribution is performed by suitably setting the illuminance distribution and by moving the wafer W in the back and forth direction relative to the irradiation area 30, while rotating the wafer W. The flood exposure which is performed with the wafer W being rotated is referred to as "rotation flood exposure". In the rotation flood exposure, by rotating the wafer W, the exposure amount in the circumferential direction of the wafer W can be uniformized, while the exposure amount in different diametrical positions of the wafer W can be differentiated. Thus, the CD deviation related to the concentric CD distribution can be canceled in the plane of the wafer W.

Figure 8:
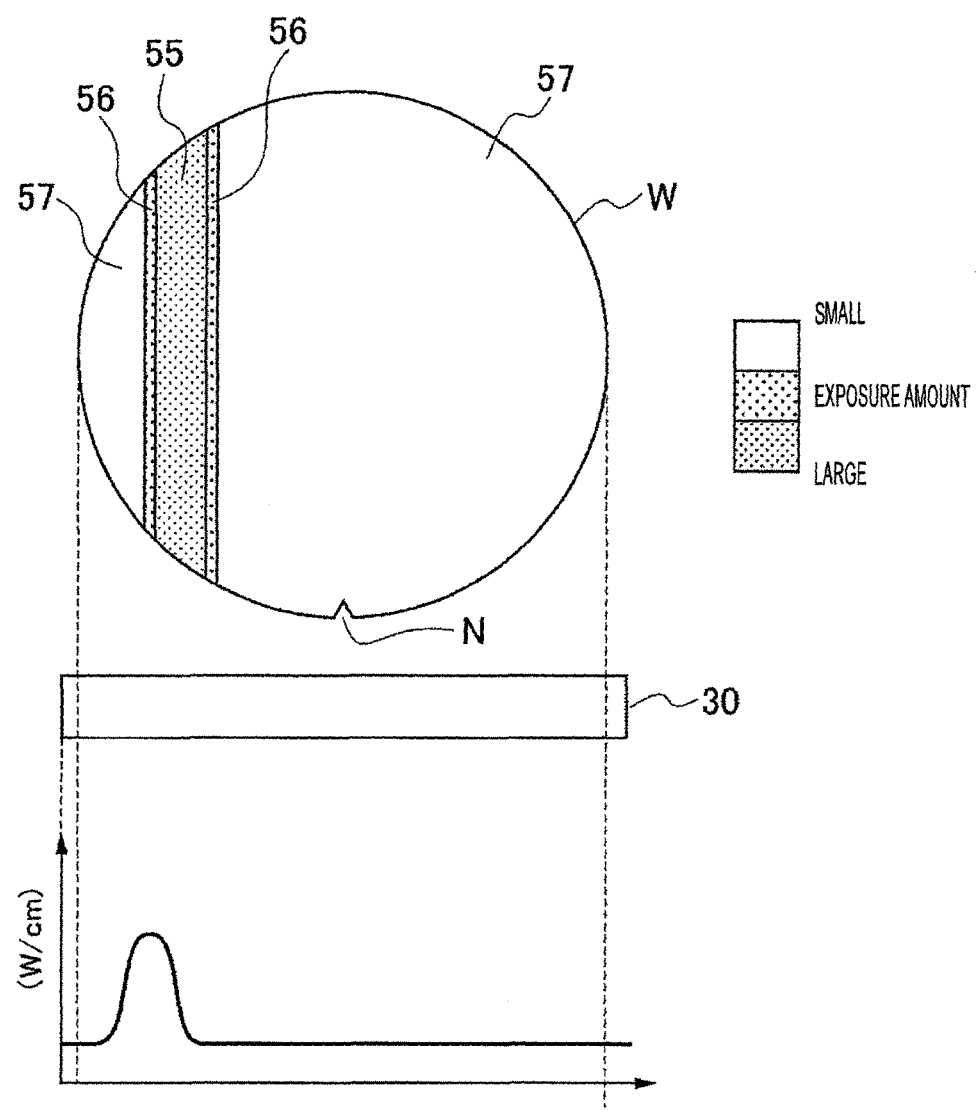
FIG. 8 is explanatory diagram for explaining the exposure amount distribution in the surface of the wafer, determined based on the CD distribution.
Figure 9:
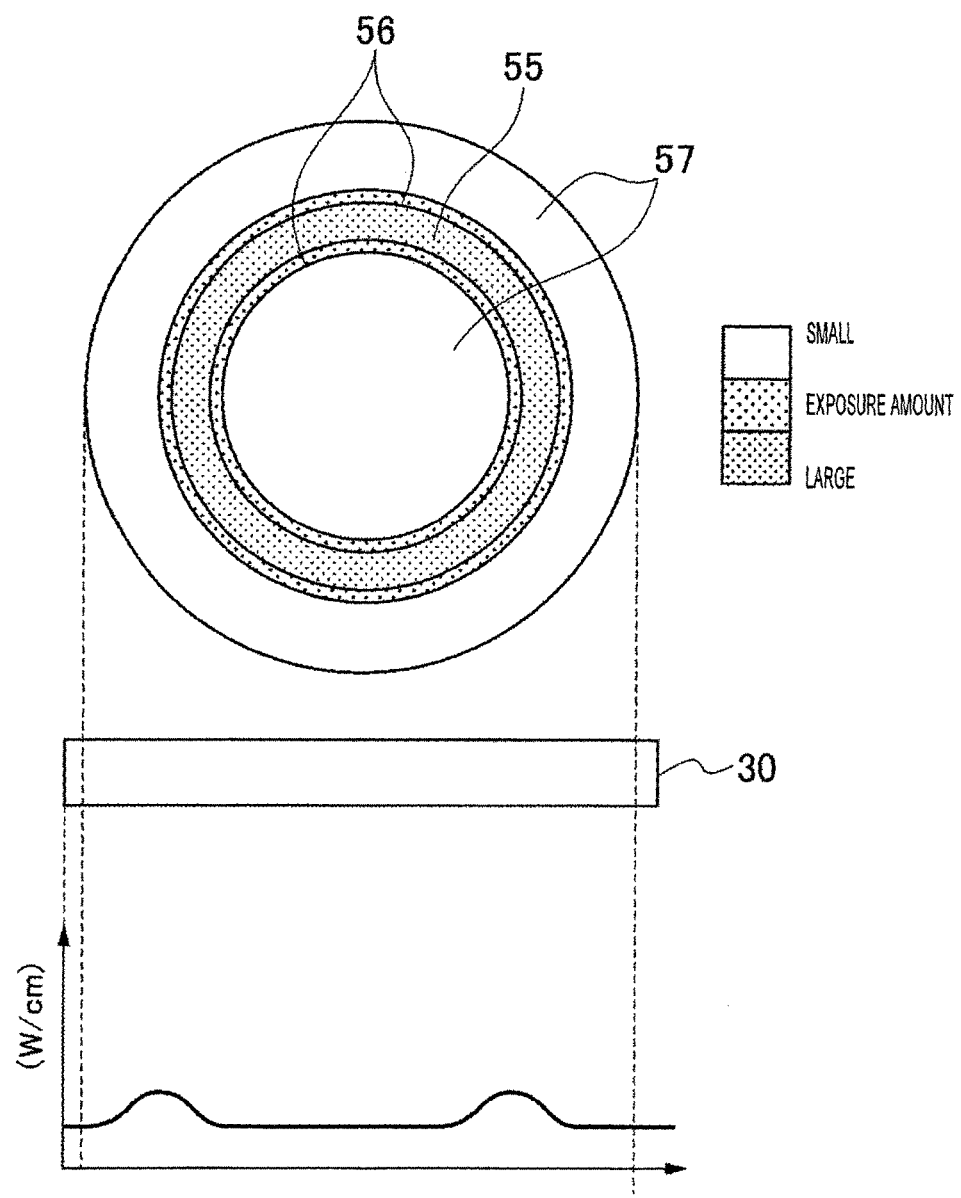
FIG. 9 is explanatory diagram for explaining the exposure amount distribution in the surface of the wafer, determined corresponding to the CD distribution.

The plan views of the wafer W in FIGS. 8 and 9 show examples of the exposure amount distribution in a plane of the wafer W that can cancel the CD deviation in the linear CD distribution and the concentric CD distribution shown in FIG. 7. In FIGS. 8 and 9, shaded areas 55 and 56 have exposure amounts larger than that of an area 57 which is not shaded. The darker shaded area 55 has a larger exposure amount than the brighter shaded area 56. The irradiation area 30 is also shown in FIGS. 8 and 9 below the wafer W having the shaded areas as described above, such that the right and left positions of the irradiation area 30 correspond to the right and left positions of the wafer W. Further, FIGS. 8 and 9 each show a graph showing the illuminance distribution of the irradiation area 30 in one example for forming the aforementioned exposure amount distribution in the plane of the wafer W. The ordinate axis of the graph shows the illuminance (unit: W/cm). In more detail, the illuminance herein is a quotient resulting from dividing an illuminance (unit: W) over a portion of the irradiation area 30 extending from one end to the other end in the short dimension direction of the irradiation area 30 by the length (unit: cm) of the irradiation area 30 in the short dimension direction. The position on the abscissa axis of the graph corresponds to the position of the irradiation area 30 in the longitudinal direction of the irradiation area 30.

In the non-rotation flood exposure and the rotation flood exposure, since the moving speed of the stage 33 in the back and forth direction affect the exposure amount of the wafer W, the moving speed is set such that a suitable exposure amount can be obtained. To be specific, (illuminance (W/cm))/(moving speed (cm/second))=exposure amount ($J/cm^2$). The illuminance in this expression is the illuminance described for the ordinate axis of the graph of FIGS. 8 and 9. The moving speed of the stage 33 and the illuminance distribution of the irradiation area 30 in the right and left direction, which are for achieving the exposure amounts required for the non-rotation flood exposure and the exposure amount required for the rotation flood exposure shown in FIGS. 8 and 9, may be determined beforehand through an experiment, for example.

Figure 10:
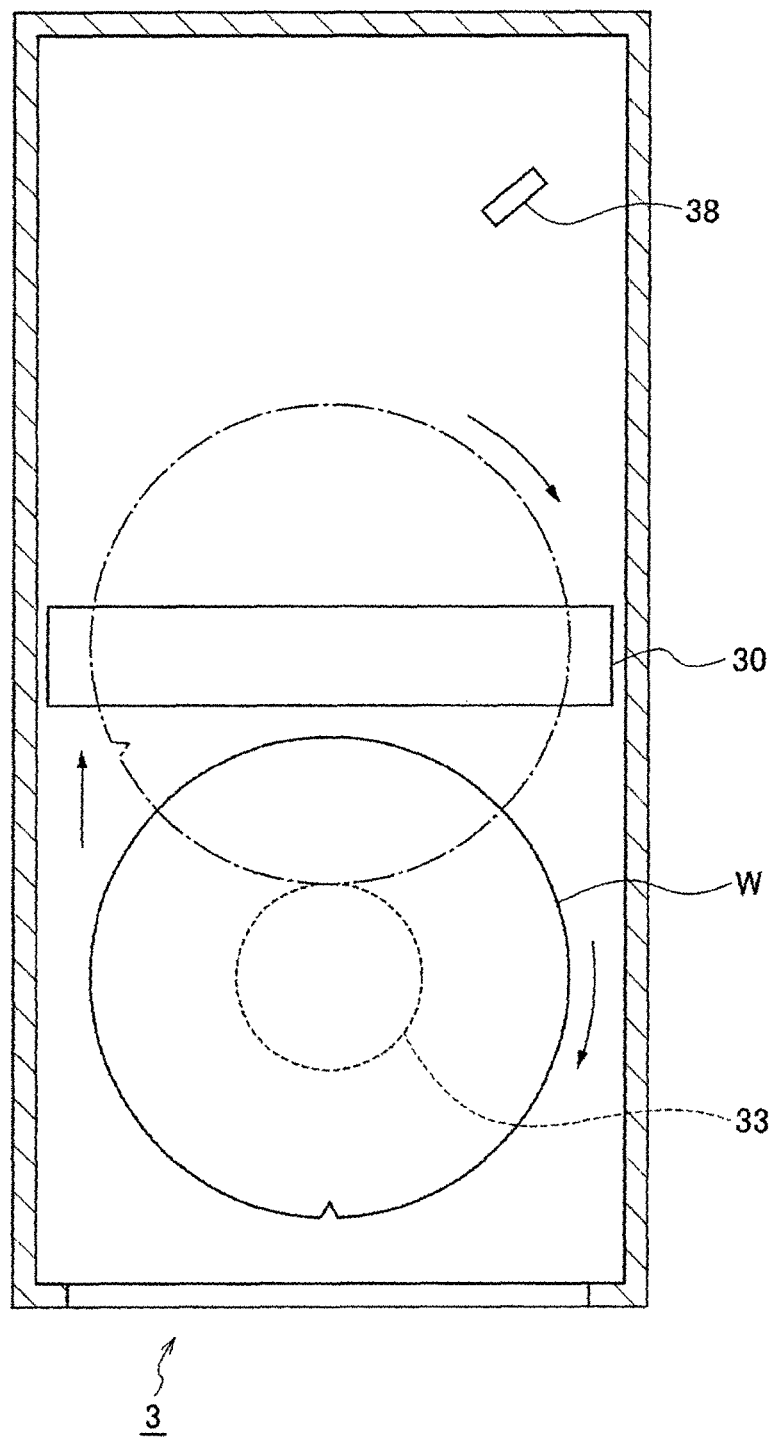
FIG. 10 is an operation diagram showing a process step performed to a wafer W in the flood exposure module.
Figure 11:
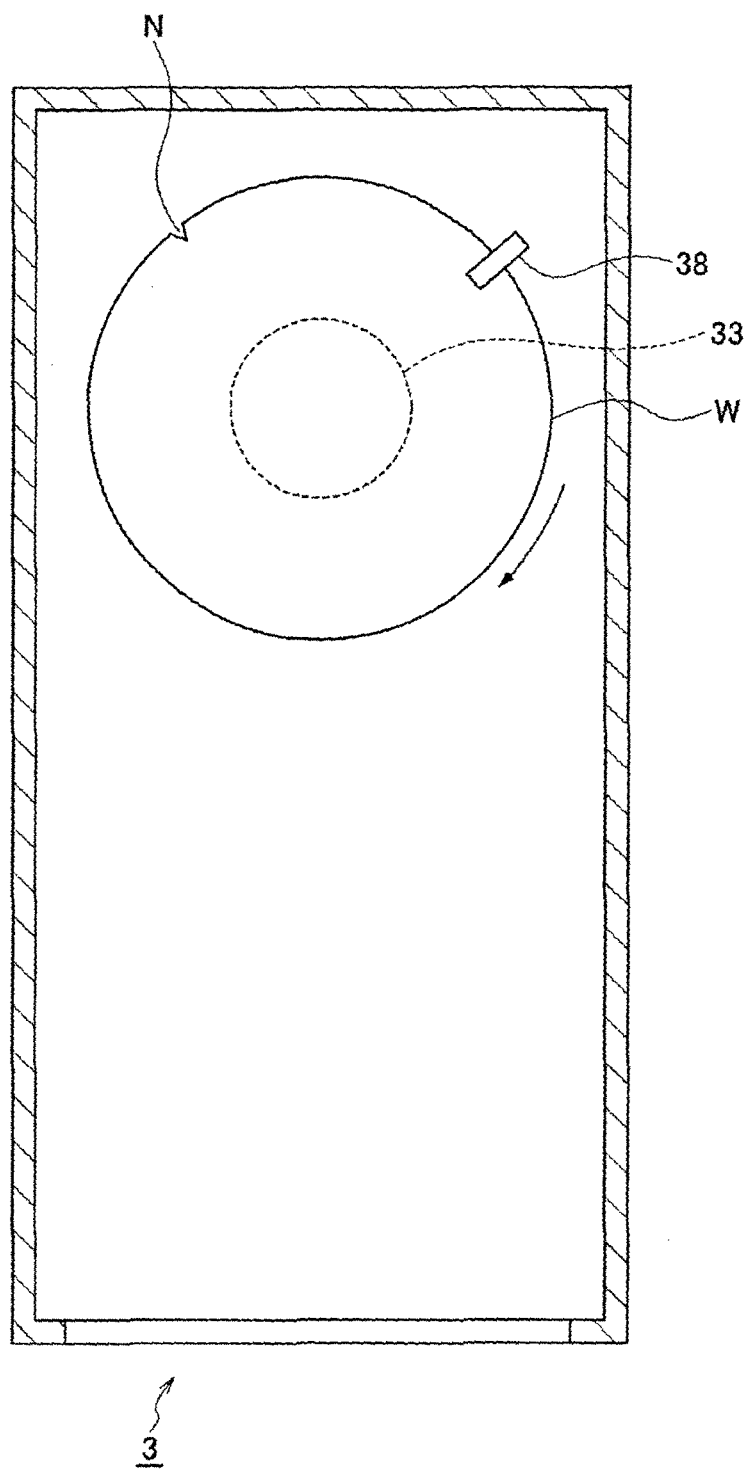
FIG. 11 is an operation diagram showing a process step performed to the wafer W in the flood exposure module.
Figure 12:
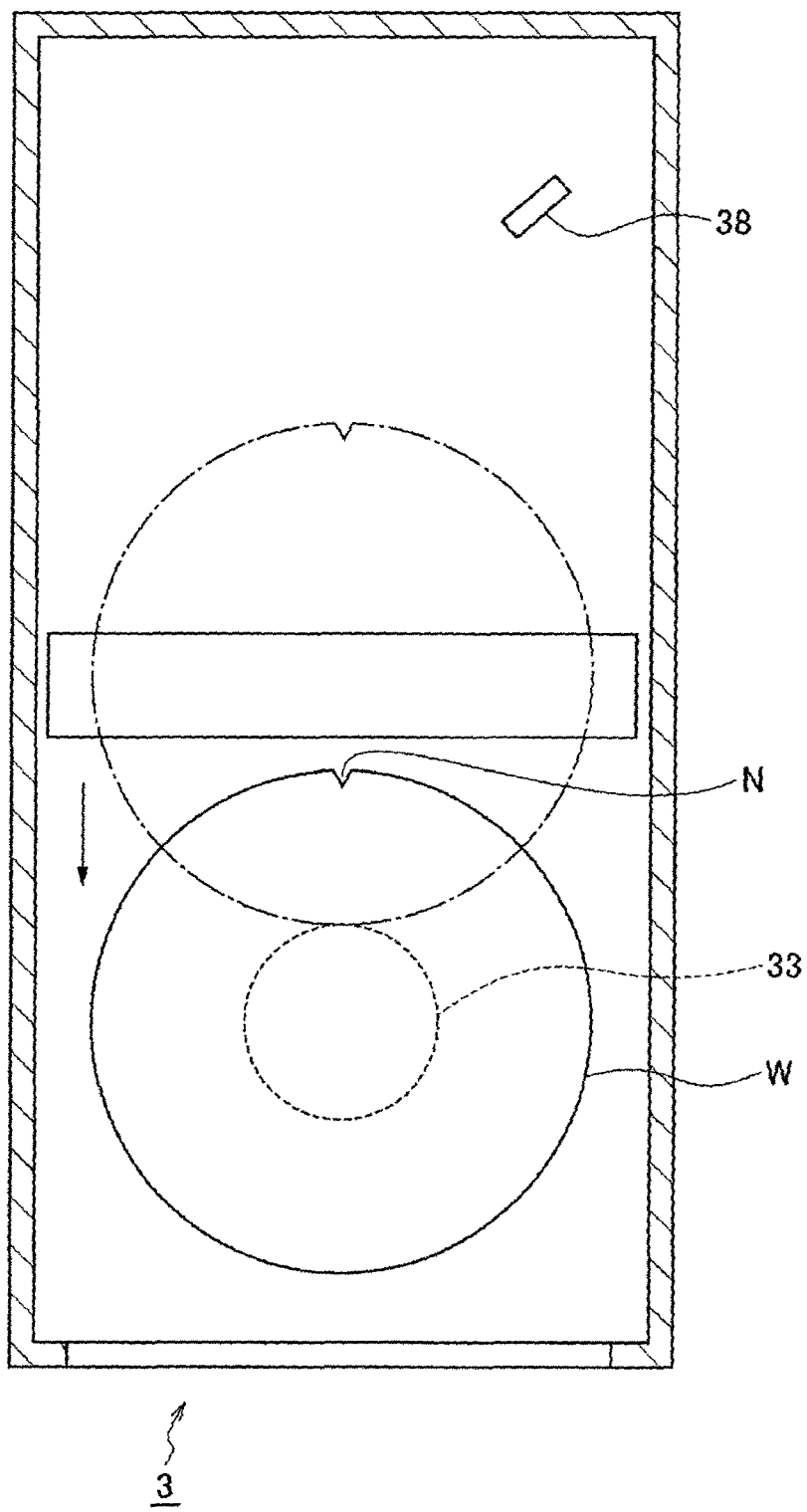
FIG. 12 is an operation diagram showing a process step performed to the wafer W in the flood exposure module.

Next, the flood exposure of the wafer W in the flood exposure module 3 is described step by step with reference to FIGS. 10 to 12. In the below description, the flood exposure is performed to the wafer W that is configured such that, if the wafer W is subjected to the flood exposure such that the exposure amounts in respective portions in the plane of the wafer W are identical to each other, the CD distribution described with reference to the lower part of FIG. 7 are obtained.

Firstly, the light quantities outputted from the respective cells 4 are adjusted such that the illuminance distribution shown in the graph of FIG. 9 is formed, while the shutter 44 is located at the close position. Then, when the wafer W is delivered by the transport arm F5 to the stage 33 located at the transfer position, the shutter 44 is moved to the open position so that the irradiation area 30 having the illuminance distribution shown in the graph of FIG. 9 is formed on the imaginary horizontal plane having the same height as the wafer W held by the stage 33. Then, the rotation flood exposure is performed (FIG. 10), such that the wafer W is moved rearward while being rotated so that the surface of the wafer W passes through the irradiation area 30 whereby the exposure amount distribution shown in FIG. 9 is formed in the plane of the wafer W.

When the whole surface of the wafer W is exposed and the stage 33 is moved to the orientation adjustment position, the shutter 44 is moved to the close position. Then, the light quantities outputted from the respective cells 4 are adjusted so as to establish the illuminance distribution described with reference to the graph of FIG. 8. Meanwhile, light is emitted from the light transmitting unit 38 to the rotating wafer W toward the light receiving unit 39. From the starting of the light emission from the light transmitting unit 38, the wafer W is rotated by 360 degrees. Based on the amount of light received by the light receiving unit 39 during the 360-degree rotation, the position of the notch N of the wafer W is detected (FIG. 11).

Then, the wafer W is rotated and is then stopped at a position where the notch N is oriented in a predetermined direction. Then, the shutter 44 is moved to the open position, the irradiation area 30 having the illuminance distribution shown in the graph of FIG. 8 is formed, and the wafer W is moved forward to pass through the irradiation area 30 so that the exposure amount distribution shown in FIG. 8 is achieved in the plane of the wafer W, so that the non-rotation flood exposure is performed (FIG. 12). Thereafter, when the shutter 44 is moved to the close position and the stage 33 is located at the transfer position, and then the wafer W is unloaded by the transport arm F5 from the flood exposure module 3.

In the flood exposure module 3, there is performed the rotation flood exposure in which the wafer W being rotated is moved rearward so that the wafer W passes through the irradiation area 30 below the cells 4 arranged in the right and left direction, and thereafter performed the non-rotation flood exposure in which the wafer W whose rotation is being stopped is moved forward so that the wafer W passes through the irradiation area 30. Thus, the exposure amounts in respective portions in the plane of the wafer W can be controlled so as to cancel the effects of the aforementioned factors 1 and 2, which factors may cause deviation of the CD from the set value in different manners from each other. That is, the exposure amounts in respective portions in the plane of the wafer W can be precisely controlled such that desired exposure amounts can be obtained. As a result, CD uniformity in the resist pattern in the plane of the wafer W can be improved.

Figure 13:
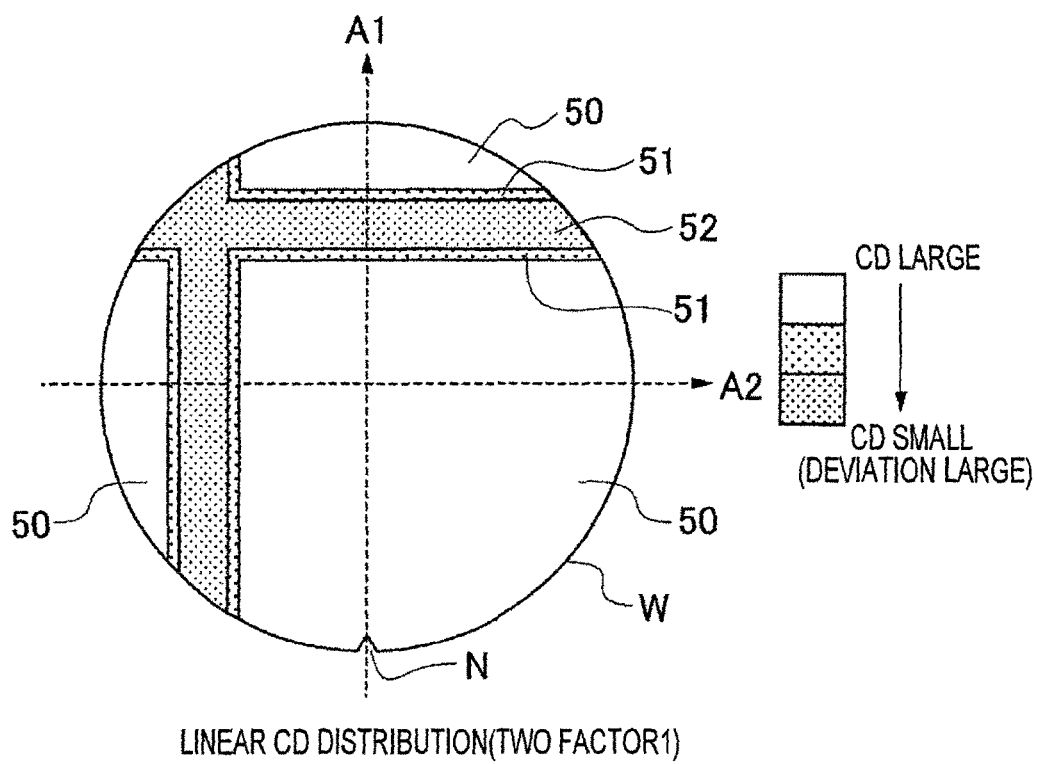
FIG. 13 is explanatory diagram for explaining the CD distribution in the surface of the wafer.

The number of times of execution of the aforementioned non-rotation flood exposure is not limited to once, and the number of times of execution of the aforementioned rotation flood exposure is not limited to once. For example, there may be a case in which the wafer W is affected by the factor 1 two or more times, so that variation of the CD occurs in different directions of the wafer W. FIG. 13 shows, using the shadings similarly to FIG. 7, linear CD distributions formed when the wafer W is affected by the factor 1 two or more times. In the example shown in FIG. 13, the wafer W is affected by the factor 1 such that the CD varies in two different directions A1 and A2 of the wafer W. The directions A1 and A2 form an angle of 90°.

Figure 14:
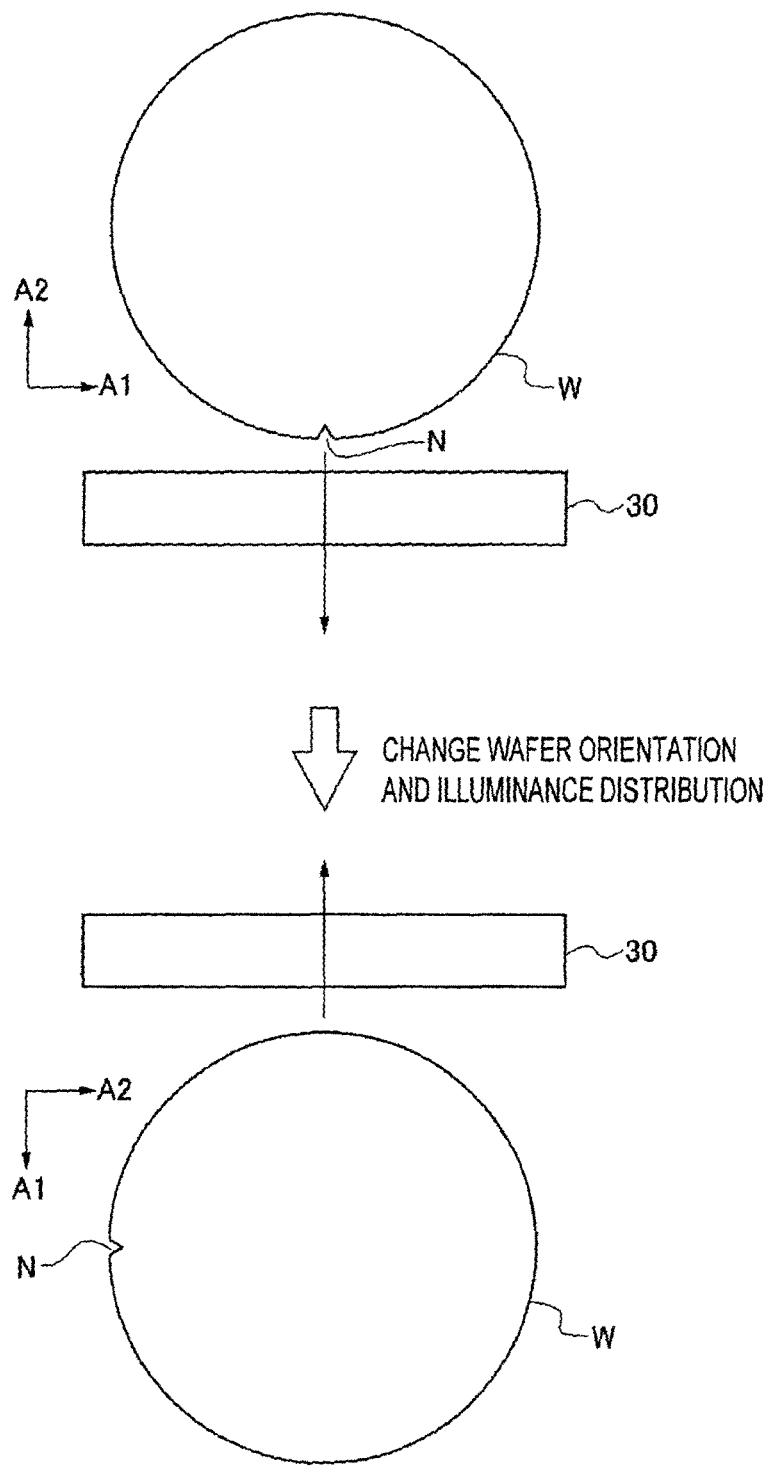
FIG. 14 is an operation diagram showing a process step performed to a wafer W in the flood exposure module.

The flood exposure for addressing the situation where the factor 1 acts on the wafer W as shown in FIG. 13 is described. In order to eliminate the influence of the factor 2 (illustration of which is omitted in FIG. 13), the rotation flood exposure is performed by moving rearward the rotating wafer W so that the wafer W passes through the irradiation area 30, as previously described with reference to FIG. 10. Following thereto, the orientation of the wafer W is adjusted such that the direction A2 corresponds to the back and forth direction, as previously described with reference to FIG. 11. Then, the first non-rotation flood exposure is performed as previously described with reference to FIG. 12, by forming the irradiation area 30 having an illuminance distribution by which the influence of the factor 1 in the direction A1 can be canceled, and by moving the wafer W forward while the rotation of the wafer W is being stopped. The upper part of FIG. 14 shows the first non-rotation flood exposure.

Thereafter, the wafer W is rotated by 90 degrees. Then, the irradiation area 30 having an illuminance distribution by which the influence of the factor 1 in the direction A2 can be canceled is formed, and the wafer W is moved rearward while the rotation of the wafer W is being stopped. That is, the second non-rotation flood exposure is performed by moving the wafer W rearward, with the orientation of the wafer W with respect to the irradiation area 30 being different from that in the first non-rotation flood exposure. The lower part of FIG. 14 shows the second non-rotation flood exposure. By performing the non-rotation exposed exposure plural times, the exposure amounts in respective portions in the plane of the wafer W can be controlled more finely. Similarly to the non-rotation flood exposure, the rotation flood exposure may be performed plural times.

In the foregoing examples, although the non-rotation flood exposure is performed after the rotation flood exposure, the rotation flood exposure may be performed after the non-rotation flood exposure. The operation for the rotation flood exposure is not limited to the foregoing operation in which the wafer W is rotated while the wafer W is being moved in the back and forth direction. The operation for the rotation flood exposure may be for example, as follows. That is, while the exposure opening 43 is being closed by the shutter 44, the wafer W is moved in the back and forth direction so as to be located below the exposure opening 43. While the movement of the wafer W in the back and forth direction is being stopped at that position, the wafer W is rotated and the exposure opening 43 is opened to form the irradiation area 30 extending along the diameter of the wafer W. After the whole surface of the rotating wafer W has been exposed, the exposure opening 43 is closed to finish the rotation flood exposure. In this case, since the central part of the wafer W is irradiated with light from the greater number of cells 4 than the peripheral part of the wafer W, the light quantities of the cells 4, which emit light to the central part of the wafer W, are set relatively small. On the other hand, in the rotation flood exposure described with reference to FIG. 10, the flood exposure is performed by rotating the wafer W while moving the wafer W with respect to the irradiation area 30 in the back and forth direction, in order to avoid the situation where the exposure amount of the central part of the wafer W is larger.

In addition, an orientation adjustment module including devices equivalent to the stage 33, the rotation mechanism 34, the light transmitting unit 38 and the light receiving unit 39 may be provided in a fore stage of the flood exposure module 3, for example. Detection of the notch N and adjustment of the orientation of the wafer W based on the notch detection are performed in the orientation adjustment module, whereby wafers W can be loaded into the flood exposure module 3 such that the wafers W are always in the same orientation. The orientation of a rotation shaft of the motor of the rotation mechanism 34 that rotates the stage 33 can be detected by the control unit 10. Thus, when the stage 33 receives the wafer W, the stage 33 can be directed in a predetermined orientation. That is, every time when the wafer W is delivered to the stage 33, the orientation of the wafer W and the orientation of the stage 33 can be constant. Due to the above feature, even if the stage 33 is slightly inclined due to assembly tolerance of the flood exposure module 3, each wafer W loaded into the flood exposure module 3 is similarly inclined. Thus, the CD uniformity in the plane of each wafer W can be more improved, by setting the light quantity of each sell 4 so as to cancel the inclination effect.

In the above case where the orientation of the wafer W is adjusted by the orientation adjustment module and the wafer W is then transported to the flood exposure module 3, the flood exposure module 3 may be configured such that the rotation amount of the motor of the rotation mechanism 34 after the wafer W has been transported to the stage 33 can be detected by the control unit 10. In this case, when the non-rotation flood exposure is performed, the wafer W can be directed in a predetermined orientation without detecting the orientation of the wafer W by the light transmitting unit 38 and the light receiving unit 39 in the flood exposure module 3. That is, it is not absolutely necessary to dispose the light transmitting unit 38 and the light receiving unit 39 for detecting the orientation of the wafer W in the flood exposure module 3. In addition, means for detecting the orientation of the wafer W is not limited to the light transmitting unit 38 and the light receiving unit 39. For example, a camera that images the surface of the wafer W may be provided in the flood exposure module 3. The control unit 10 may obtain image data outputted from the camera, so as to detect the notch N.

In a case where a wafer W having thereon a resist film, which is not formed of a photosensitized chemically amplified resist, is subjected to the process in the flood exposure module in any one of the foregoing embodiments, a resist pattern can be made uniform at respective portions in the plane of the wafer W, with exposure amounts at respective portions being appropriate. That is, the aforementioned flood exposure modules can be used for exposing the wafer W coated with a resist that is not a chemically amplified type. Further, the aforementioned flood exposure modules 3 can be used for exposing a resist film or an organic film other than a resist film that is hardened depending on the exposure amount. In this case, the hardening degree of the film can be controlled so that the film can be etched uniformly in the plane of the wafer W when the film is etched. Further, if a film that decomposes by a light exposure is formed on the surface of the wafer W, the aforementioned flood exposure modules can be used for controlling the film thickness distribution in the plane of the wafer W. That is, the application of the aforementioned flood exposure modules is not limited to the adjustment of the CD of a resist pattern.

Thus, the exposure apparatus of the present invention is not limited to an apparatus for exposing a resist, but may be a light irradiation apparatus that emits light to a substrate to process a substrate.

The position at which the flood exposure module 3 is disposed is not limited to the aforementioned position, if the flood exposure module 3 is used for adjusting the CD of a resist pattern. For example, a block (intermediate block), which includes a transport mechanism for transferring the wafer W, the flood exposure module 3 and a transfer module, may be disposed between the processing block D2 and the interface block D3. In this case, the wafer W subjected to a pattern exposure is transported from the interface block D3 to the transfer module TRS51 or TRS61 of the tower T2. The wafer W is then transported by the transport mechanism of the intermediate block to the flood exposure module, and then transported to the transfer module in the intermediate block. Then, the transport arm F5 or F6 of the unit block E5 or E6 accesses the transfer module to transport the wafer W subjected to the flood exposure to the unit block E5 or E6. Following thereto, the wafer W is subjected to the succeeding processes.

In this specification, the expression "exposing the whole surface of a wafer W" means "exposing at least the whole device-forming area (i.e., an area where the semiconductor devices are formed) of the wafer W". Thus, the situation where the whole device-forming area of the wafer W is exposed while the peripheral portion of the wafer W outside the device-forming area is not exposed falls within the definition of the expression "exposing the whole surface of a (the) wafer W". In addition, the number of rows (in the back and forth direction) and the number of columns (in the back and forth direction) of the LEDs 47 of the light source unit 40 are not limited to those in the foregoing embodiment. Moreover, a homogenizer comprising a lens array, a fly-eye lens or a prism may be disposed below the LEDs 47 to uniformize the illuminance distribution of the irradiation area 30 in the back and forth direction. In addition, instead of moving the wafer W with respect to the light source unit 40, the light source unit 40 may be moved with resect to a wafer W to perform the respective flood exposures. The present invention is not limited to the aforementioned embodiments, and the respective embodiments can be combined with each other or suitably modified.

What is claimed is:

1. An exposure apparatus comprising:
   a stage on which a substrate having a diameter is placed;
   a plurality of light irradiation units arrayed in a right and left direction and configured to emit light independently of each other to different positions in the right and left direction on a surface of the substrate, such that the plurality of light irradiation units form a strip-like irradiation area having a length not shorter than the diameter of the substrate and extending continuously from one end to the other end, in the right to left direction, of the surface of the substrate placed on the stage;
   a rotation mechanism configured to rotate the substrate placed on the stage relative to the strip-like irradiation area;
   a stage moving mechanism configured to move the stage relative to the strip-like irradiation area in a back and forth direction; and
   a control unit configured to output control signals that make said exposure apparatus perform a first step that rotates the substrate relative to the strip-like irradiation area having a first illuminance distribution formed by the plurality of light irradiation units such that the whole surface of the substrate is exposed, and a second step that moves the substrate in the back and forth direction relative to the strip-like irradiation area having a second illuminance distribution, which is different from the first illuminance distribution, formed by the plurality of light irradiation units while rotation of the substrate is being stopped, such that the whole surface of the substrate is exposed, wherein the first illuminance distribution causes uneven exposure amount distribution over the surface of the substrate, and the second illuminance distribution causes uneven exposure amount distribution over the surface of the substrate, which is different from the uneven exposure amount distribution over the surface of the substrate caused by the first illuminance distribution.

2. The exposure apparatus according to claim 1, wherein the first step rotates the substrate relative to the strip-like irradiation area, while moving the substrate in the back and forth direction relative to the strip-like irradiation area.

3. The exposure apparatus according to claim 1, further comprising:
   a detection unit configured to detect an orientation of the substrate placed on the stage; and
   an orientation adjustment mechanism configured to adjust the orientation of the substrate by the rotation mechanism based on a detection result detected by the detection unit, before the second step is performed.

4. The exposure apparatus according to claim 1, wherein the control unit is configured to make said exposure apparatus perform a third step that moves the substrate in the back and forth direction relative to the strip-like irradiation area having a third illuminance distribution, which is different from the second illuminance distribution, formed by the plurality of light irradiation units, such that the whole surface of the substrate is exposed, while rotation of the substrate is being stopped with an orientation of the substrate with respect to the strip-like irradiation area in the third step being different from an orientation of the substrate with respect to the strip-like irradiation area in the second step.

5. The exposure apparatus according to claim 1, wherein said exposure apparatus is used for exposing the substrate on which a resist film having been subjected to a pattern exposure using a pattern mask is formed.

6. An exposure method comprising:
   placing a substrate having a diameter on a stage;
   forming a strip-like irradiation area extending from one end to the other end of a surface of the substrate by means of a plurality of light irradiation units, arrayed in a right and left direction, that emit light independently of each other to different positions of the surface of the substrate in the right and left direction, the strip-like irradiation area extending in the right and left direction and having a length not shorter than the diameter of the substrate;
   rotating the substrate placed on the stage relative to the strip-like irradiation area having a first illuminance distribution formed by the plurality of the light irradiation units, such that the whole surface of the substrate is exposed; and
   moving the substrate placed on the stage relative to the strip-like irradiation area having a second illuminance distribution, which is different from the first illuminance distribution, formed by the plurality of light irradiation units in a back and forth direction, while rotation of the substrate is being stopped, such that the whole surface of the substrate is exposed, wherein the first illuminance distribution causes uneven exposure amount distribution over the surface of the substrate, and the second illuminance distribution causes uneven exposure amount distribution over the surface of the substrate, which is different from the uneven exposure amount distribution over the surface of the substrate caused by the first illuminance distribution.

7. A non-transitory storage medium storing a computer program to be used in an exposure apparatus for exposing a substrate, wherein the computer program includes a group of steps for performing the exposure method according to claim 6.

\* \* \* \* \*